US010600706B2

(12) United States Patent
Lee

(10) Patent No.: US 10,600,706 B2
(45) Date of Patent: Mar. 24, 2020

(54) SEMICONDUCTOR PACKAGE INCLUDING ORGANIC INTERPOSER

(71) Applicant: SAMSUNG ELECTRONICS CO., LTD., Suwon-si (KR)

(72) Inventor: Dong Hun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/925,338

(22) Filed: Mar. 19, 2018

(65) Prior Publication Data

US 2019/0122949 A1     Apr. 25, 2019

(30) Foreign Application Priority Data

Oct. 19, 2017  (KR) .......................... 10-2017-0135957

(51) Int. Cl.
*H01L 23/31*     (2006.01)
*H01L 23/16*     (2006.01)
(Continued)

(52) U.S. Cl.
CPC .......... *H01L 23/3121* (2013.01); *H01L 23/16* (2013.01); *H01L 23/498* (2013.01); *H01L 24/29* (2013.01); *H01L 25/105* (2013.01); *H01L 25/16* (2013.01); *H01L 25/18* (2013.01); *H01L 23/3128* (2013.01); *H01L 24/13* (2013.01);
(Continued)

(58) Field of Classification Search
None
See application file for complete search history.

(56) References Cited

U.S. PATENT DOCUMENTS 6,313,521 B1 * 11/2001 Baba ..................... H01L 21/563
                                                           257/659
7,741,160 B1     6/2010 Wang et al.
(Continued)

FOREIGN PATENT DOCUMENTS

CN     107195593 A    9/2017
JP       5284235 B2    9/2013
(Continued)

OTHER PUBLICATIONS

Korean Office Action dated Jan. 28, 2019 issued in Korean Patent Application No. 10-2017-0135957 (with English translation).
(Continued)

*Primary Examiner* — Telly D Green
(74) *Attorney, Agent, or Firm* — Sughrue Mion, PLLC

(57) ABSTRACT

A semiconductor package including an organic interposer includes: the organic interposer including insulating layers and wiring layers formed on the insulating layers; a stiffener disposed on the interposer and having a through-hole; a first semiconductor chip disposed in the organic through-hole on the organic interposer; a second semiconductor chips disposed adjacent to the first semiconductor chip in the through-hole on the organic interposer; and an underfill resin filling at least portions of the through-hole and fixing the first semiconductor chip and the second semiconductor chip, wherein the connection pads of the first semiconductor chip and the second semiconductor chip are electrically connected to each other through the wiring layers of the organic interposer.

16 Claims, 8 Drawing Sheets

(51) Int. Cl.
   *H01L 23/00* (2006.01)
   *H01L 25/16* (2006.01)
   *H01L 25/10* (2006.01)
   *H01L 25/18* (2006.01)
   *H01L 23/498* (2006.01)

(52) U.S. Cl.
   CPC .............. *H01L 24/16* (2013.01); *H01L 24/32* (2013.01); *H01L 24/73* (2013.01); *H01L 24/92* (2013.01); *H01L 2224/0401* (2013.01); *H01L 2224/131* (2013.01); *H01L 2224/16221* (2013.01); *H01L 2224/16227* (2013.01); *H01L 2224/16238* (2013.01); *H01L 2224/32225* (2013.01); *H01L 2224/73204* (2013.01); *H01L 2224/73253* (2013.01); *H01L 2224/92125* (2013.01); *H01L 2224/92225* (2013.01); *H01L 2225/1023* (2013.01); *H01L 2225/1058* (2013.01); *H01L 2924/09701* (2013.01); *H01L 2924/10253* (2013.01); *H01L 2924/1433* (2013.01); *H01L 2924/1434* (2013.01); *H01L 2924/15192* (2013.01); *H01L 2924/15311* (2013.01); *H01L 2924/15331* (2013.01); *H01L 2924/18161* (2013.01); *H01L 2924/37001* (2013.01)

(56) References Cited

U.S. PATENT DOCUMENTS

| | | |
|---|---|---|
| 9,704,790 B1 | 7/2017 | Wu et al. |
| 2008/0054490 A1 | 3/2008 | McLellan |
| 2008/0122087 A1 | 5/2008 | Jobetto |
| 2010/0078786 A1 | 4/2010 | Maeda |
| 2013/0043581 A1 | 2/2013 | Negoro |
| 2015/0130078 A1 | 5/2015 | Hong et al. |
| 2015/0340303 A1 | 11/2015 | Oh et al. |
| 2016/0043047 A1 | 2/2016 | Shim et al. |
| 2017/0287825 A1 | 10/2017 | Lee et al. |

FOREIGN PATENT DOCUMENTS

| | | | | |
|---|---|---|---|---|
| KR | 10-2008-0048411 A | 6/2008 | | |
| KR | 10-2015-0045095 A | 4/2015 | | |
| KR | 10-2015-0054551 A | 5/2015 | | |
| KR | 10-2015-0135611 A | 12/2015 | | |
| KR | 20150135611 A | * 12/2015 | ........... | H01L 21/486 |
| KR | 10-2017-0112363 A | 10/2017 | | |
| KR | 20170112363 A | * 10/2017 | ....... | H01L 23/49827 |
| TW | 201310590 A1 | 3/2013 | | |
| TW | 201618196 A | 5/2016 | | |

OTHER PUBLICATIONS

Office Action issued in corresponding Korean Patent Application No. 10-2017-0135957, dated Jul. 20, 2018.

Taiwanese Office Action dated Mar. 6, 2019 issued in Taiwanese Patent Application No. 107110373 (with English translation).

Communication dated Jul. 29, 2019, issued by the Korean Patent Office in counterpart Korean Application No. 10-2017-0135957.

* cited by examiner

SEMICONDUCTOR PACKAGE INCLUDING ORGANIC INTERPOSER

CROSS-REFERENCE TO RELATED APPLICATION(S)

This application claims the benefit of priority to Korean Patent Application No. 10-2017-0135957 filed on Oct. 19, 2017 in the Korean Intellectual Property Office, the disclosure of which is incorporated herein by reference in its entirety.

TECHNICAL FIELD

The present disclosure relates to a semiconductor package including an organic interposer through which a plurality of semiconductor chips disposed with each other in a side-by-side manner are electrically connected to each other.

BACKGROUND

In accordance with improvements of specifications of sets and use of a high bandwidth memory (HBM), an interposer market has grown. Currently, silicon has been used as a material of the interposer, but development of a glass or organic materials has been conducted in order to increase an area and reduce costs.

Meanwhile, an interposer package has been manufactured by performing a package process of attaching a die to the interposer and molding the die. Here, when a molding process is not performed, 2.5D package handling is not conducted, such that the interposer package may not be connected to a ball grid array (BGA) substrate, or the like. Therefore, rigidity of the interposer package has been maintained by the molding.

However, when the molding process is performed, warpage of the interposer package may occur, fillability of an underfill resin may be deteriorated, and a crack between the die and a molding material may occur, due to a mismatch between coefficients of thermal expansion (CTEs) of the interposer and the molding material of the die.

SUMMARY

An aspect of the present disclosure may provide a semiconductor package including an organic interposer capable of having excellent rigidity and a heat dissipation effect, and having excellent reliability without performing a molding process.

According to an aspect of the present disclosure, a semiconductor package including an organic interposer may be provided, in which a stiffener having a through-hole having a special form is disposed on the organic interposer, a plurality of semiconductor chips are disposed in the through-hole, and the plurality of semiconductor chips are only fixed by an underfill process instead of a molding process.

According to an aspect of the present disclosure, a semiconductor package including an organic interposer may include: the organic interposer including insulating layers and wiring layers formed on the insulating layers; a stiffener disposed on the organic interposer and having a through-hole; a first semiconductor chip disposed in the through-hole on the organic interposer and having an active surface having connection pads disposed thereon and an inactive surface opposing the active surface; a plurality of second semiconductor chips disposed adjacent to the first semiconductor chip in the through-hole on the organic interposer and having active surfaces having connection pads disposed thereon and inactive surfaces opposing the active surfaces, respectively; and an underfill resin filling at least portions of the through-hole and fixing the first semiconductor chip and the plurality of second semiconductor chips, wherein the connection pads of the first semiconductor chip and the plurality of second semiconductor chips are electrically connected to each other through the wiring layers of the organic interposer, and at least portions of the stiffener are disposed between the plurality of second semiconductor chips.

According to another aspect of the present disclosure, a semiconductor package including an organic interposer may include: a stiffener having a through-hole; a first semiconductor chip disposed in the through-hole and having an active surface having connection pads disposed thereon and an inactive surface opposing the active surface; second semiconductor chips disposed adjacent to the first semiconductor chip in the through-hole and having active surfaces having connection pads disposed thereon and inactive surfaces opposing the active surfaces, respectively; an underfill resin filling at least portions of the through-hole and fixing the first semiconductor chip and the second semiconductor chips; and the organic interposer disposed on the stiffener, the underfill resin, the active surface of the first semiconductor chip, and the active surfaces of the second semiconductor chips, wherein the organic interposer includes wiring layers electrically connected to the connection pads of the first semiconductor chip and the second semiconductor chips, the connection pads of the first semiconductor chip and the second semiconductor chips are electrically connected to each other through the wiring layers of the organic interposer, and an upper surface of the underfill resin has a step with respect to an upper surface of the stiffener, the inactive surface of the first semiconductor chip, and the inactive surfaces of the second semiconductor chips.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or stylized for clarity.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
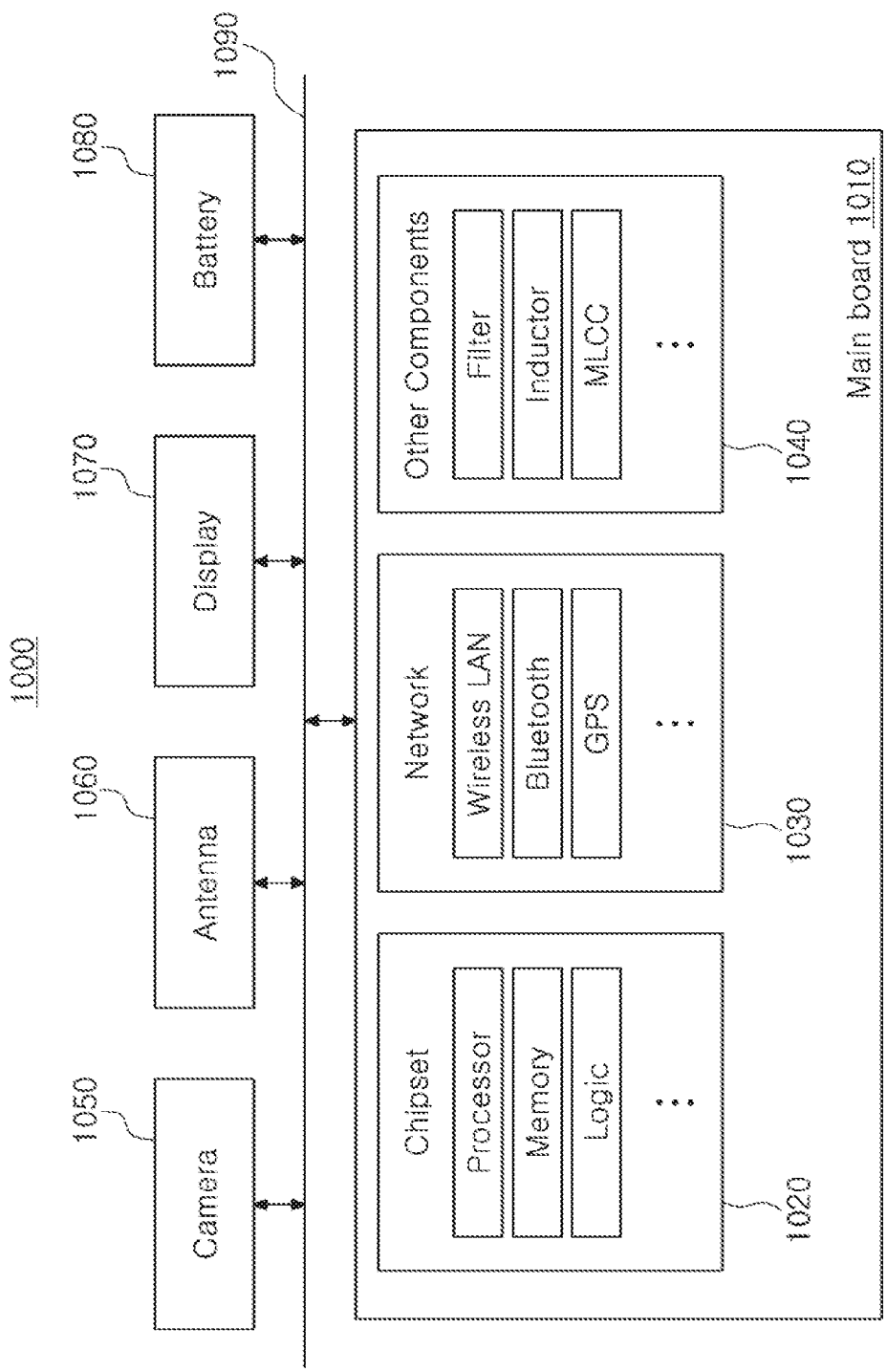
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, and may also include other types of chip-related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components used for various other purposes, and the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive component, or the like. However, the electronic device 1000 is not limited thereto, and may be any other electronic device processing data.

Figure 2:
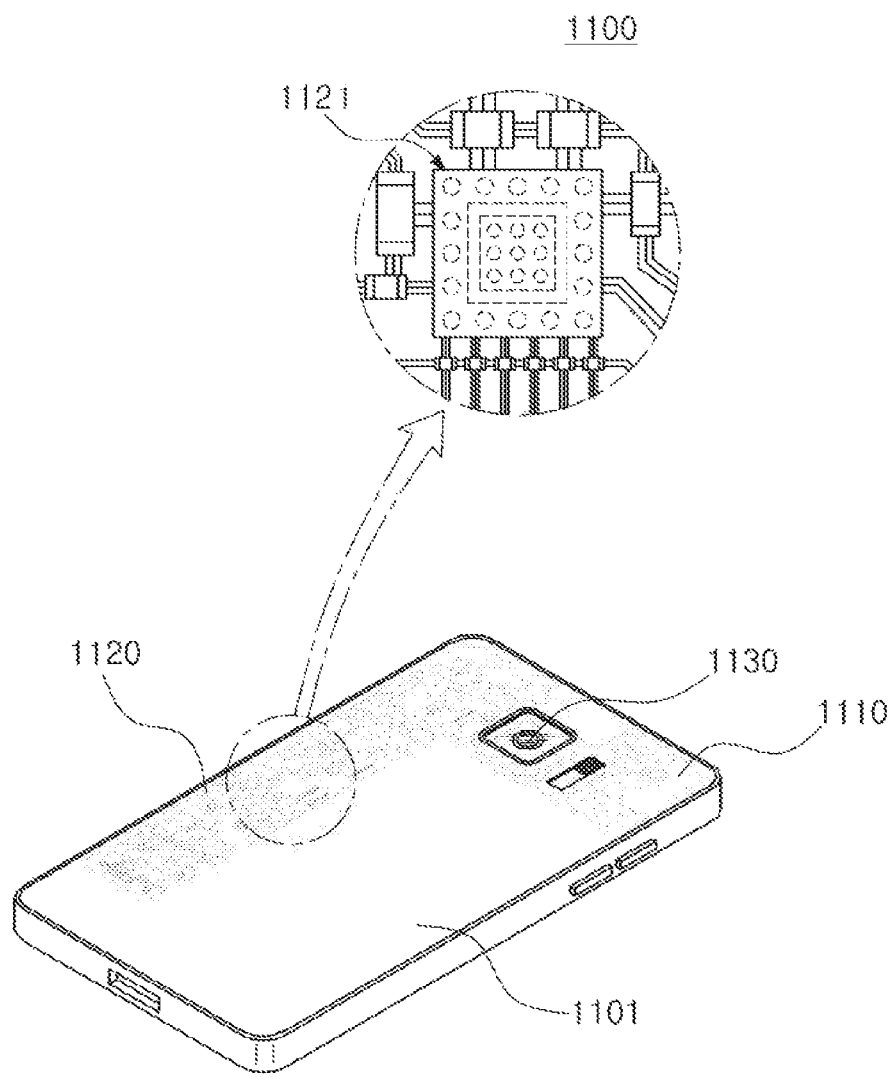
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a mainboard 1110 may be accommodated in a body 1101 of a smartphone 1100, and various components 1120 may be physically or electrically connected to the mainboard 1110. In addition, other components that may or may not be physically or electrically connected to the mainboard 1110, such as a camera 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, and may be other electronic devices as described above.

Semiconductor Package Including Organic Interposer

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, and may be packaged and used in an electronic device, or the like, in a packaged state.

Here, semiconductor packaging is required, due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard may be desirable.

A semiconductor package including an organic interposer manufactured by the packaging technology described above will hereinafter be described in more detail with reference to the drawings.

Figure 3:
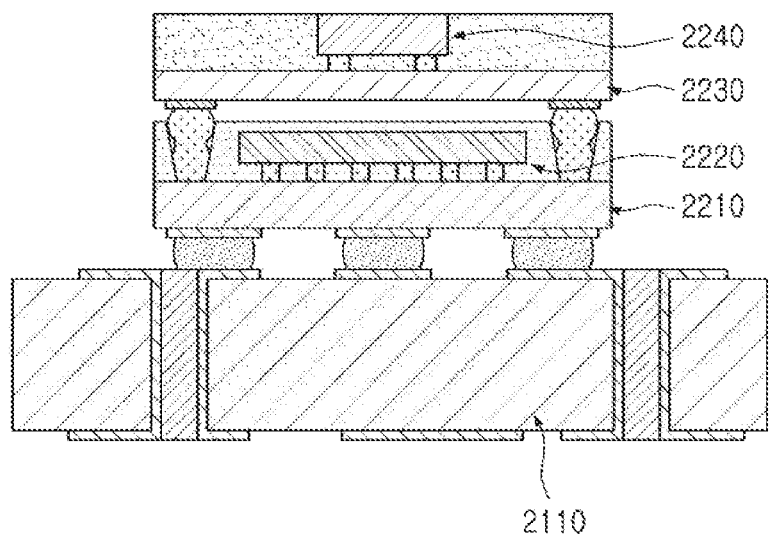
FIG. 3 is a schematic cross-sectional view illustrating a case in which a 3D ball grid array (BGA) package is mounted on a main board of an electronic device.

FIG. 3 is a schematic cross-sectional view illustrating a case in which a 3D ball grid array (BGA) package is mounted on a main board of an electronic device.

An application specific integrated circuit (ASIC) such as a graphics processing unit (GPU) among semiconductor chips is very expensive, and it is thus very important to perform packaging on the ASIC at a high yield. For this purpose, a ball grid array (BGA) substrate 2210, or the like, that may redistribute several thousands to several hundreds of thousands of connection pads is prepared before a semiconductor chip is mounted, and the semiconductor chip that is expensive, such as a GPU 2220, or the like, is mounted and packaged on the BGA substrate 2210 by surface mounting technology (SMT), or the like, and is then mounted finally on a main board 2110.

Meanwhile, in a case of the GPU 2220, it is required to significantly reduce a signal path between the GPU 2220 and a memory such as a high bandwidth memory (HBM). To this end, a product in which a semiconductor chip such as the HBM 2240 is mounted and then packaged on an interposer 2230, and is then stacked on a package in which the GPU 2220 is mounted, in a package-on-package (POP) form is used. However, in this case, a thickness of a device is excessively increased, and there is a limitation in significantly reducing the signal path.

Figure 4:
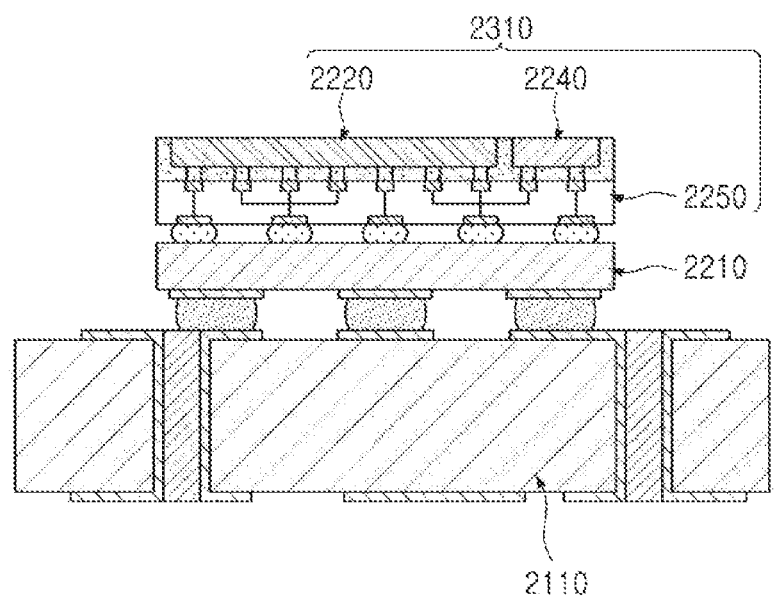
FIG. 4 is a schematic cross-sectional view illustrating a case in which a 2.5D organic interposer package is mounted on a main board.

FIG. 4 is a schematic cross-sectional view illustrating a case in which a 2.5D organic interposer package is mounted on a main board.

As a method for solving the problem described above, it may be considered to manufacture a semiconductor package 2310 including an organic interposer by 2.5D interposer technology of surface-mounting and then packaging a first semiconductor chip such as a GPU 2220 and a second semiconductor chip such as an HBM 2240 side-by-side with each other on an organic interposer 2250. In this case, the GPU 2220 and the HBM 2240 having several thousands to several hundreds of thousands of connection pads may be redistributed by the organic interposer 2250, and may be electrically connected to each other through the shortest path. In addition, when the semiconductor package 2310 including an organic interposer is again mounted and redistributed on a BGA substrate 2210, or the like, it may be finally mounted on a main board 2110. However, it is very difficult to form through-silicon vias (TSVs) in the organic interposer 2250, and a cost required for manufacturing the organic interposer 2250 is significantly high, and the organic interposer 2250 is thus limited in increasing an area and reducing a cost.

Figure 5:
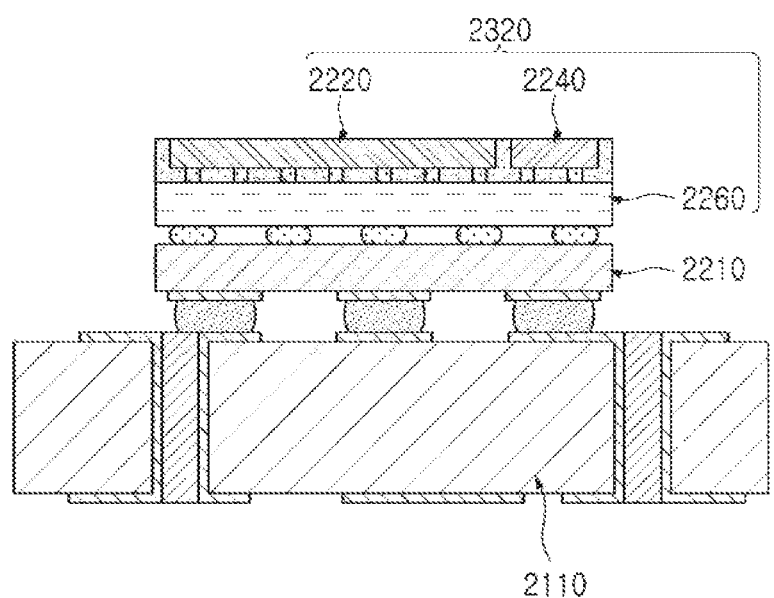
FIG. 5 is a schematic cross-sectional view illustrating a case in which a 2.5D organic interposer package is mounted on a main board.

FIG. 5 is a schematic cross-sectional view illustrating a case in which a 2.5D organic interposer package is mounted on a main board.

As a method for solving the problem described above, it may be considered to use an organic interposer 2260 instead of the organic interposer 2250. For example, it may be considered to manufacture a semiconductor package 2320 including an organic interposer by 2.5D interposer technology of surface-mounting and then packaging a first semiconductor chip such as a GPU 2220 and a second semiconductor chip such as an HBM 2240 side-by-side with each other on the organic interposer 2260. In this case, the GPU 2220 and the HBM 2240 having several thousands to several hundreds of thousands of connection pads may be redistributed by the organic interposer 2260, and may be electrically connected to each other through the shortest path. In addition, when the semiconductor package 2320 including an organic interposer is again mounted and redistributed on a BGA substrate 2210, or the like, it may be finally mounted on a main board 2110. In addition, the organic interposer may be advantageous in increasing an area and reducing a cost.

Meanwhile, the semiconductor package 2320 including an organic interposer is manufactured by performing a package process of mounting chips 2220 and 2240 on the organic interposer 2260 and then molding the chips. The reason is that when a molding process is not performed, package handling is not conducted, such that the package may not be connected to the BGA substrate 2210, or the like. Therefore, rigidity of the package is maintained by the molding. However, when the molding process is performed, warpage of the package may occur, fillability of an underfill resin may be deteriorated, and a crack between a die and a molding material may occur, due to mismatch between coefficients of thermal expansion (CTEs) of the interposer 2260 and the molding material of the chips 2220 and 2240, as described above.

Figure 6:
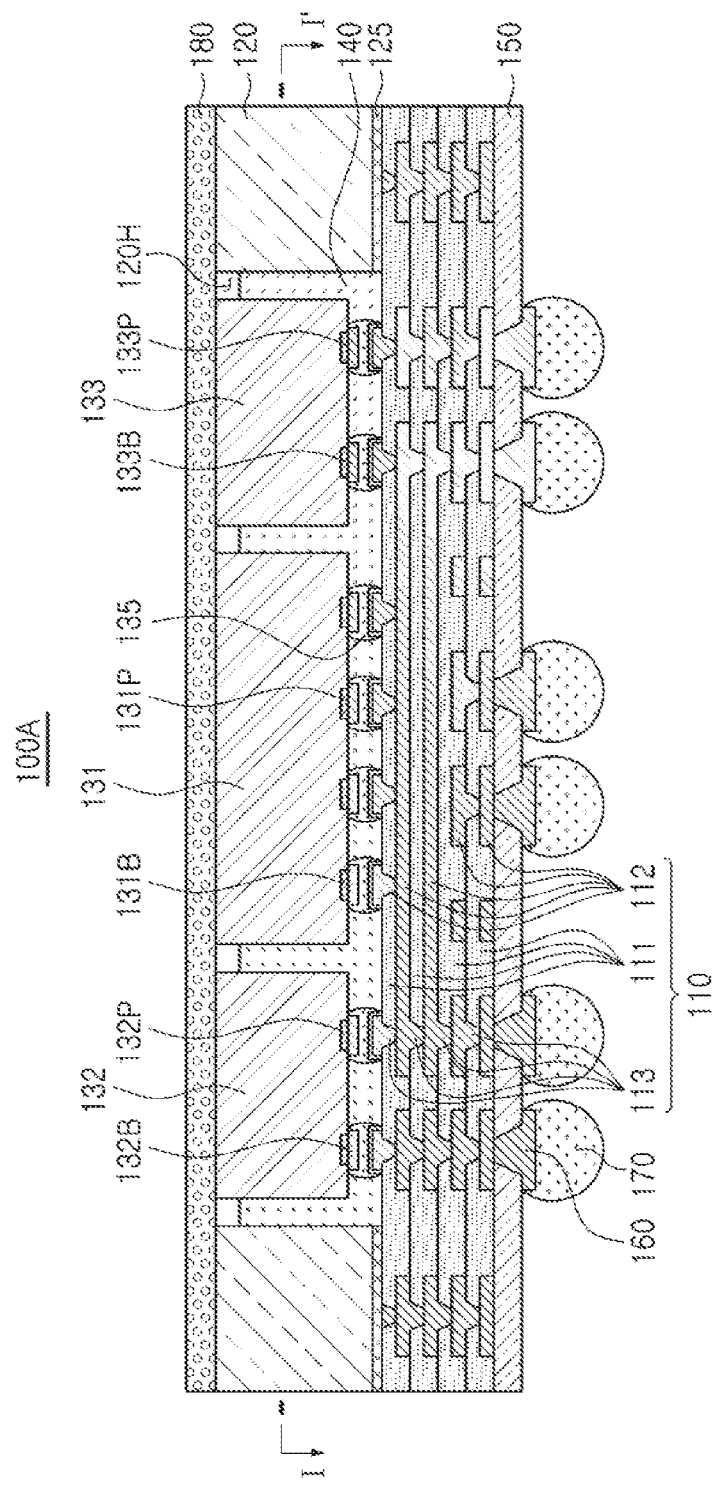
FIG. 6 is a schematic cross-sectional view illustrating an example of a semiconductor package including an organic interposer.

FIG. 6 is a schematic cross-sectional view illustrating an example of a semiconductor package including an organic interposer.

Figure 7:
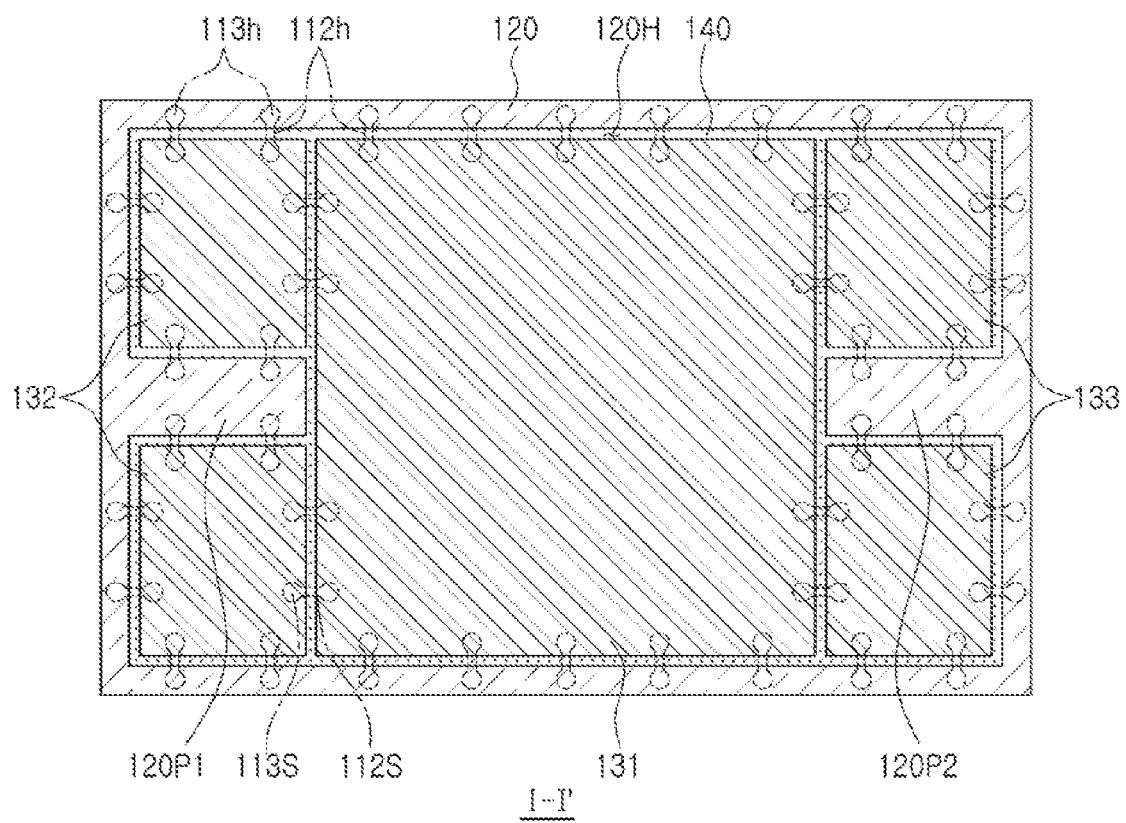
FIG. 7 is a schematic plan view taken along line I-I' of the semiconductor package including an organic interposer of FIG. 6.

FIG. 7 is a schematic plan view taken along line I-I' of the semiconductor package including an organic interposer of FIG. 6.

Referring to FIGS. 6 and 7, a semiconductor package 100A including an organic interposer according to an exemplary embodiment in the present disclosure may include the interposer 110 including insulating layers 111 and wiring layers 112 and vias 113 formed on and in the insulating layers 111, a stiffener 120 disposed on the interposer 110 and having a through-hole 120H, a first semiconductor chip 131 disposed in the through-hole 120H on the interposer 110 and having an active surface having connection pads 131P disposed thereon and an inactive surface opposing the active surface, a plurality of second semiconductor chips 132 and 133 disposed side-by-side with the first semiconductor chip 131 in the through-hole 120H on the interposer 110 and having active surfaces having connection pads 132P and 133P disposed thereon and inactive surfaces opposing the active surfaces, respectively, and an underfill resin 140 filling at least portions of the through-hole 120H and fixing the first semiconductor chip 131 and the plurality of second semiconductor chips 132 and 133. If necessary, the semiconductor package 100A including an organic interposer may further include a passivation layer 150 disposed on the surface of the interposer 110 opposite the surface adjacent to the first semiconductor chip 131, an underbump metal layer 160 formed in openings of the passivation layer 150 and electrically connected to the wiring layer 112 of the interposer 110, and electrical connection structures 170 disposed on the underbump metal layer 160 and electrically connected to the wiring layer 112 of the interposer 110 through the underbump metal layer 160.

The connection pads 131P, 132P and 133P of the first semiconductor chip 131 and the plurality of second semiconductor chips 132 and 133 may be electrically connected to each other through the wiring layers 112 of the interposer 110, and at least portions, that is, protruding portions 120P1 and 120P2, of the stiffener 120 may be disposed between the plurality of second semiconductor chips 132 and 133. For example, the plurality of second semiconductor chips 132 and 133 may be disposed side-by-side with the first semiconductor chip 131 at one side and the other side of the first semiconductor chip 131, respectively, a first protruding portion 120P1 and a second protruding portion 120P2 of the stiffener 120 may be disposed, respectively, between the plurality of second semiconductor chips 132 and the plurality of second semiconductor chips 133 disposed, respectively, at one side and the other side of the first semiconductor chip 131. In this case, an upper surface of the underfill resin 140 may have a step with respect to an upper surface of the stiffener 120, the inactive surface of the first semiconductor chip 131, and the inactive surfaces of the plurality of second semiconductor chips 132 and 133. That is, the upper surface of the underfill resin 140 may be disposed on a level below the upper surface of the stiffener 120, the inactive surface of the first semiconductor chip 131, and the inactive surfaces of the plurality of second semiconductor chips 132 and 133. The semiconductor package 100A including an organic interposer according to the exemplary embodiment is manufactured without performing a molding process. In this case, at least portions of walls of the through-hole 120H of the stiffener 120, side surfaces of the first semiconductor chip 131, and side surfaces of each of the plurality of second semiconductor chips 132 and 133 may be externally exposed.

In the semiconductor package 100A including an organic interposer according to the exemplary embodiment having such a structure, the stiffener 120 may be disposed on the interposer 110, and particularly even in a case in which a plurality of semiconductor chips 131, 132, and 133 are disposed, the protruding portions 120P1 and 120P2 of the stiffener 120 are disposed between the semiconductor chips 131, 132, and 133, and an empty space of the through-hole 120H thus almost disappears, such that rigidity of the semiconductor package 100A including an organic interposer may be very excellently maintained without performing the molding process. Therefore, warpage of the semiconductor package 100A including an organic interposer may be very effectively controlled. In addition, since the stiffener 120 serves as a dam when the underfill resin 140 is filled, the stiffener 120 may prevent generation of an underfill void between the semiconductor chips 131, 132, and 133, and may prevent the underfill resin 140 from externally flowing out. In addition, since the molding process is not used, an underfill defect may be suppressed to improve reliability of the semiconductor package 100A including an organic interposer. In addition, a heat dissipation effect of the semiconductor package 100A including an organic interposer may be excellent due to the exposed semiconductor chips 131, 132, and 133, and the stiffener 120. In addition, the semiconductor chips 131, 132, and 133, and the stiffener 120 may be formed at the same height, such that a heat dissipation member 180 may be easily attached to the semiconductor chips 131, 132, and 133, and the stiffener 120. Therefore, heat may be more effectively dissipated.

The respective components included in the semiconductor package 100A including an organic interposer according to the exemplary embodiment will hereinafter be described below in more detail.

The interposer 110 may redistribute the connection pads 131P, 132P, and 133P of the semiconductor chips 131, 132, and 133. Several thousands to several hundreds of thousands of connection pads 131P, 132P, and 133P of the semiconductor chips 131, 132, and 133 having various functions may be redistributed by the interposer 110, and may be physically or electrically externally connected through the electrical connection structures 170 depending on the functions. In addition, the connection pads 131P, 132P, and 133P of the semiconductor chips 131, 132, and 133 may be electrically connected to each other through the shortest paths by the interposer 110. The interposer 110 may include the insulating layers 111, the wiring layers 112 formed on or in the insulating layers 111, and the vias 113 penetrating through the insulating layers 111 and electrically connecting the wiring layers 112 formed on different layers to each other. The number of layers of the interposer 110 may be more than that illustrated in the drawing or be less than that illustrated in the drawing. The interposer 110 having such a form may be used as a 2.5D type organic interposer.

The insulating layer 111 may serve as a dielectric layer of the interposer 110. For example, an insulating material may be used as a material of each of the insulating layers 111. In this case, a thermosetting resin such as an epoxy resin, a thermoplastic resin such as a polyimide resin, a resin in which the thermosetting resin and the thermoplastic resin are mixed with an inorganic filler, for example, Ajinomoto build-up film (ABF), or the like, may be used as the insulating material. Alternatively, a resin in which a thermosetting resin or a thermoplastic resin is impregnated together with an inorganic filler in a core material such as a glass fiber (or a glass cloth or a glass fabric), for example, prepreg, or the like, may also be used as the insulating material. Alternatively, a photosensitive insulating material such as a photoimagable dielectric (PID) resin may be used the insulating material. When the insulating layers 111 are multiple layers, materials of the insulating layers 111 may be the same as each other, and may also be different from each other, if necessary. When the insulating layers 111 are the multiple layers, the insulating layers 111 may be integrated with each other depending on a process, such that a boundary therebetween may also not be apparent.

The wiring layers 112 may serve to substantially redistribute the connection pads 131P, 132P, and 133P and connect the connection pads 131P, 132P, and 133P to each other depending on a signal, power, or the like. That is, the connection pads 131P, 132P, and 133P may be electrically connected to each other through connection patterns 112s and connection vias 113s of the wiring layer 112. If necessary, the wiring layer 112 may include heat dissipation patterns 112h and heat dissipation vias 113h connecting the respective semiconductor chips 131, 132, and 133 to the stiffener 120. In this case, heat generated from the semiconductor chips 131, 132, and 133 may be dissipated through the stiffener 120, and more effective heat dissipation may thus be implemented.

A material of each of the wiring layers 112 may be a conductive material such as copper (Cu), aluminum (Al), silver (Ag), tin (Sn), gold (Au), nickel (Ni), lead (Pb), titanium (Ti), or alloys thereof. The wiring layers 112 may perform various functions depending on designs of their corresponding layers. For example, the wiring layers 112 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112 may include via pads, electrical connection structures pads, and the like. A surface treatment layer P may be formed on surfaces of patterns serving as pads for mounting the semiconductor chips 131, 132, and 133 in the wiring layer 112. The surface treatment layer P is not particularly limited as long as it is known in the related art, but may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like, but is not limited thereto.

The vias 113 may electrically connect the wiring layers 112 formed on different layers to each other, resulting in an electrical path in the semiconductor package 100A including an organic interposer. A material of each of the vias 113 may be a conductive material such as copper (Cu), aluminum (Al), silver (Ag), tin (Sn), gold (Au), nickel (Ni), lead (Pb), titanium (Ti), or alloys thereof. The vias 113 may be completely filled with a conductive material, but are not limited thereto. A cross-sectional shape of each of the vias 113 may be an approximately reverse trapezoidal shape in the drawing, but is not limited thereto.

The stiffener 120 may further improve rigidity of the semiconductor package 100A including an organic interposer. The stiffener 120 may have the through-hole 120H. The first semiconductor chip 131 and the plurality of second semiconductor chips 132 and 133 may be disposed adjacent to each other in the through-hole 120H to be spaced apart from the stiffener 120 by predetermined distances. The side surfaces of the semiconductor chips 131, 132, and 133 may be surrounded by the stiffener 120. The plurality of second semiconductor chips 132 and 133 may be disposed at one side and the other side of the first semiconductor chip 131, respectively, in the through-hole 120H, and the first protruding portion 120P1 and the second protruding portion 120P2 of the stiffener 120 may be disposed, respectively, between the plurality of second semiconductor chips 132 and the plurality of second semiconductor chips 133 to make a space of the through-hole 120H narrow. In this case, the rigidity of the semiconductor package 100A including an organic interposer may be further improved, and the semiconductor chips 132, 132, and 133 may be firmly fixed even by a very small amount of underfill resin 140. The stiffener 120 may be attached to the interposer 110 through a suitable adhesion member 125 such as, for example, an epoxy resin.

A material of the stiffener 120 may be a metal or ceramic based material. In this case, the rigidity of the semiconductor package 100A including an organic interposer may be excellently maintained, and a difference in a CTE may be significantly reduced to effectively control the warpage of the semiconductor package 100A including an organic interposer. In addition, since the metal or ceramic based material has thermal conductivity better than that of a general molding resin, insulating resin, or the like, heat dissipation characteristics may also be improved. In addition, an etching process rather than a laser drill process may be performed as a process of forming the through-hole 120H, and a defect due to a foreign material may thus be avoided. The metal based material may be an alloy having excellent rigidity and thermal conductivity, in addition to a general metal such as copper (Cu), aluminum (Al), or the like. In this case, the alloy may be an alloy including at least iron, for example, an Fe—Ni based alloy (Invar), but is not limited thereto. In addition, also in a case in which a ceramic based material such as a zirconia based ($ZrO_2$) material, an alumina based ($Al_2O_3$) material, a silicon carbide based (SiC) material, a silicon nitride based ($Si_3N_4$) material, or the like, is used instead of the alloy, a similar effect may be achieved. If necessary, an insulating material may be used as the material of the stiffener 120. For example, a thermosetting resin such as an epoxy resin, a thermoplastic resin such as a polyimide resin, a resin in which the thermosetting resin and the thermoplastic resin are impregnated together with an inorganic filler in a core material such as a glass fiber, or the like, for example, prepreg, or the like, may be used as the material of the stiffener 120.

Each of the semiconductor chips 131, 132, and 133 may be an integrated circuit (IC) provided in an amount of several hundreds to several millions of elements or more integrated in a single chip. In this case, a base material of a body of each of the semiconductor chips may be silicon (Si), germanium (Ge), gallium arsenide (GaAs), or the like. Various circuits may be formed on each of the bodies. The connection pads 131P, 132P, and 133P of the semiconductor chips 131, 132, and 133 may electrically connect the semiconductor chips 131, 132, and 133 to other components. A material of each of the connection pads 131P, 132P, and 133P may be a conductive material such as aluminum (Al), or the like. A passivation layer exposing the connection pads 131P, 132P, and 133P may be formed on each of the bodies, and may be an oxide film, a nitride film, or the like, or a double layer of an oxide layer and a nitride layer. An insulating layer, and the like, may also be further disposed in required positions. Redistribution layers may be further formed on the active surfaces of the semiconductor chips 131, 132, and 133, if necessary, and low melting point metals 131B, 132B, and 133B, or the like, may also be connected to the connection pads 131P, 132P, and 133P, respectively. The low melting point metals 131B, 132B, and 133B may be metals having a melting point lower than that of the connection pads 131P, 132P, and 133P, for example, solders or alloys including solders. The semiconductor chips 131, 132, and 133 may be connected to an exposed wiring layer 112 of an upper portion of the interposer 110 through the connection pads 131P, 132P, and 133P and/or the low melting point metals 131B, 132B, and 133B, and connection members 135 such as solders, or the like, may be used for the connection. The respective semiconductor chips 131, 132, and 133 may be fixed to the interposer 110 by a suitable underfill resin 140.

The first semiconductor chip 131 may be an ASIC such as a GPU. Each of the plurality of second semiconductor chips 132 and 133 may be a memory such as an HBM. That is, each of the semiconductor chips 131, 132, and 133 may be an expensive chip having several hundreds of thousands or more of inputs/outputs (I/Os), but is not limited thereto. For example, first and second memories 132 such as an HBM, or the like, may be disposed side-by-side with an ASIC 131 such as a GPU, or the like, at one side of the ASIC 131, and third and fourth memories 133 such as an HBM, or the like, may be disposed side-by-side with an ASIC 131 such as a GPU, or the like, at the other side of the ASIC 131. The first protruding portion 120P1 may be disposed between the first and second memories 132, and the second protruding portion 120P2 may be disposed between the third and fourth memories 133.

The underfill resin 140 may fix the semiconductor chips 131, 132, and 133 to the interposer 110. A suitable material including epoxy, or the like, may be used as a material of the underfill resin 140. In the semiconductor package 100A including an organic interposer according to the exemplary embodiment, the semiconductor chips 131, 132, and 133 are disposed in the through-hole 120H of the stiffener 120 after the stiffener 120 having the protruding portions 120P1 and 120P2 is introduced. Therefore, the semiconductor chips 131, 132, and 133 may be fixed only by a small amount of underfill resin 140, and a molding or encapsulating process may be omitted. The upper surface of the underfill resin 140 may have a step with respect to the upper surface of the stiffener 120, the inactive surface of the first semiconductor chip 131, and the inactive surfaces of the second semiconductor chips 132 and 133. That is, the underfill resin 140 may fill only portions of a space of the through-hole 120H. Therefore, at least portions of side surfaces of the stiffener 120, at least portions of the side surfaces of the first semiconductor chip 131, and at least portions of the side surfaces of the second semiconductor chips 132 and 133 may be externally exposed.

The passivation layer 150 may protect the interposer 110 from external physical or chemical damage. A material of the passivation layer 150 is not particularly limited. For example, an insulating material may be used as the material of the passivation layer 150. In this case, the insulating material may be the material described as the insulating material of the insulating layer 111 of the interposer 110 described above, for example, the ABF.

The underbump metal layer 160 may improve connection reliability of the electrical connection structures 170 to improve reliability of the semiconductor package 100A including an organic interposer. The underbump metal layer 160 may be formed in the openings of the passivation layer 150, and may be electrically connected to the wiring layer 112 of the interposer 110. The underbump metal layer 160 may be formed by a suitable metallization method. That is, the underbump metal layer 160 may include a suitable metal such as copper (Cu).

The electrical connection structure 170 may physically or electrically externally connect the semiconductor package 100A including an organic interposer. For example, the semiconductor package 100A including an organic interposer may be mounted on a BGA substrate, or the like, through the electrical connection structures 170. Each of the electrical connection structures 170 may be formed of a conductive material, for example, a solder, or the like. However, this is only an example, and a material of each of the electrical connection structures 170 is not limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several thousands to several hundreds of thousands according to the numbers of connection pads 131P, 132P, and 133P, or may be provided in an amount of several thousands to several hundreds of thousands or more or several thousands to several hundreds of thousands or less.

The heat dissipation member 180 may be any suitable heat spreader. The heat dissipation member 180 may be formed of a metal in order to effectively dissipate heat, but is not limited thereto. The upper surface of the stiffener 120 and the inactive surfaces of the respective semiconductor chips 131, 132, and 133 may be disposed on the same level, and the heat dissipation member 180 may thus be easily attached to the upper surface of the stiffener 120 and the inactive surfaces of the respective semiconductor chips 131, 132, and 133. A phrase "the same level" means that levels are substantially the same as each other, and a fine error is ignored. When the heat dissipation member 180 is disposed, a space between the heat dissipation member 180 and the underfill resin 140 may be an empty space. The heat dissipation member 180 may be attached to the stiffener 120 through a suitable adhesion member such as an epoxy resin, but is not limited thereto.

Figure 8:
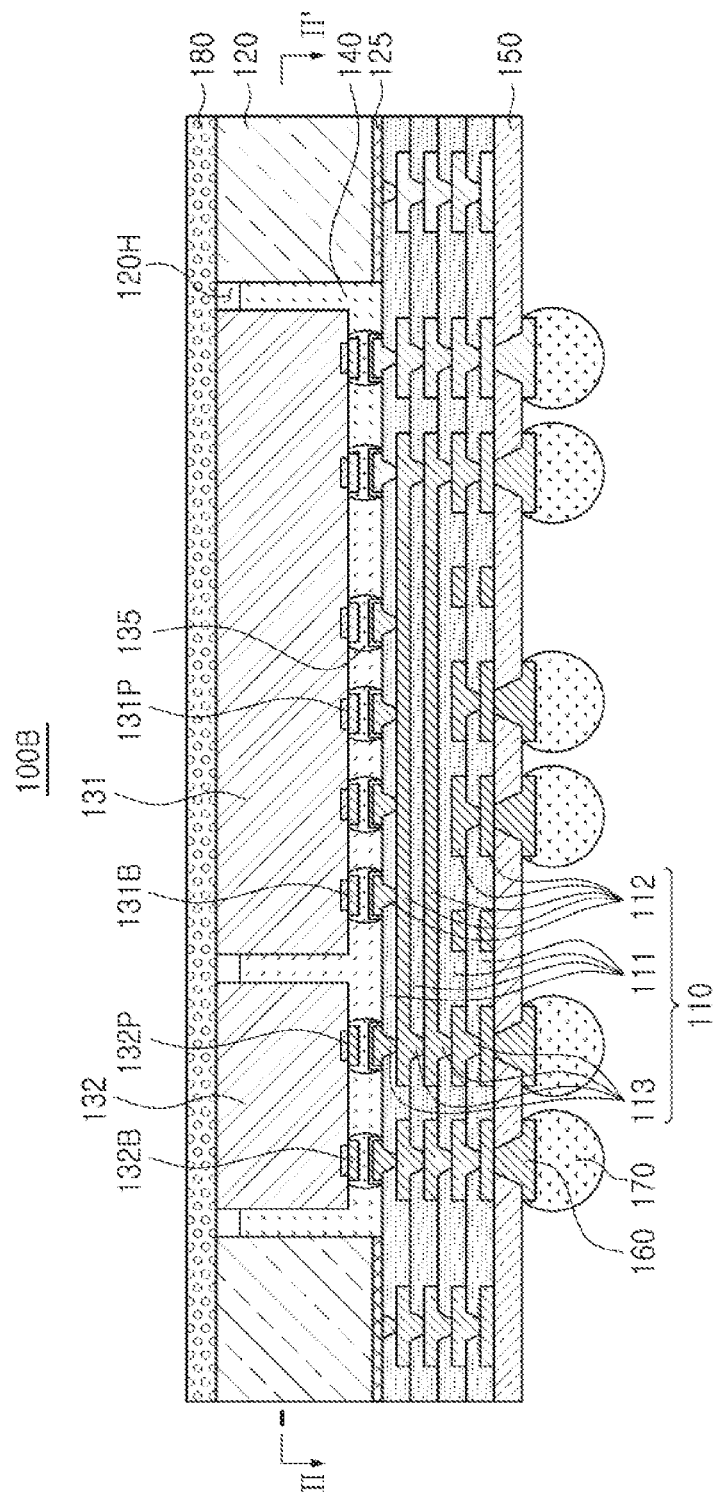
FIG. 8 is a schematic cross-sectional view illustrating another example of a semiconductor package including an organic interposer.

FIG. 8 is a schematic cross-sectional view illustrating another example of a semiconductor package including an organic interposer.

Figure 9:
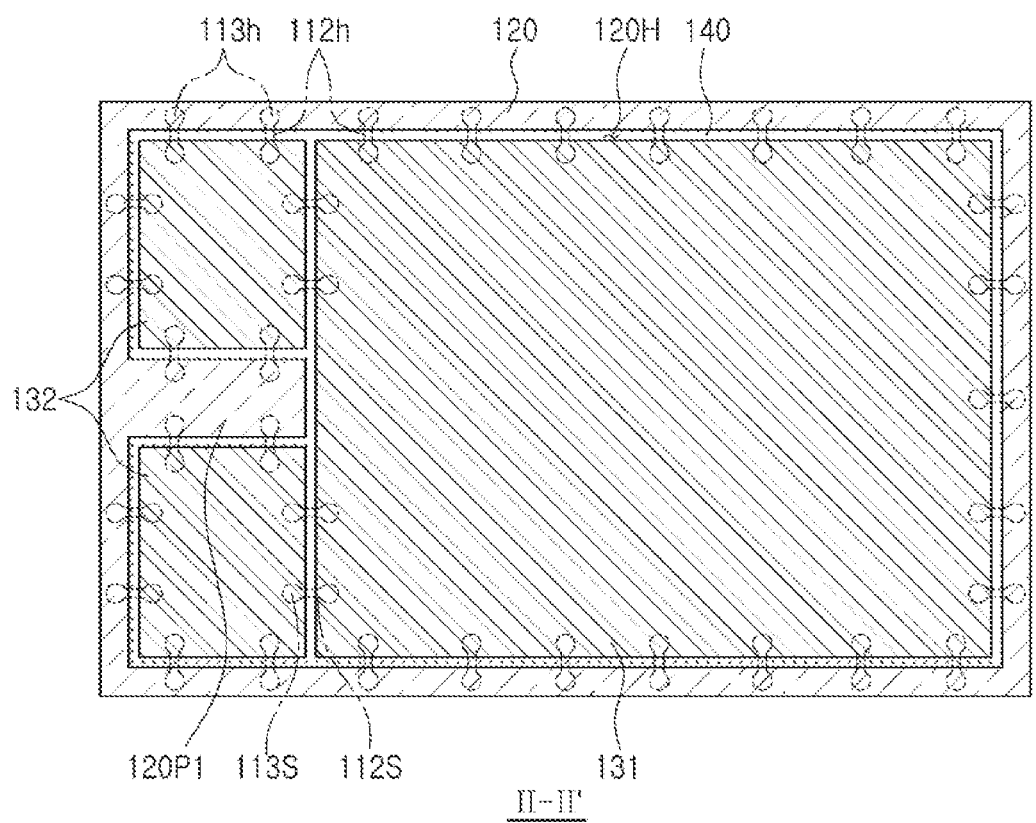
FIG. 9 is a schematic plan view taken along line II-II' of the semiconductor package including an organic interposer of FIG. 8.

FIG. 9 is a schematic plan view taken along line II-II' of the semiconductor package including an organic interposer of FIG. 8.

Referring to FIGS. 8 and 9, in a semiconductor package 100B including an organic interposer according to another exemplary embodiment in the present disclosure, a plurality of second semiconductor chips 132 may be disposed side-by-side with a first semiconductor chip 131 at only one side of the first semiconductor chip 131. That is, the number and a disposition of second semiconductor chips 132 may be changed depending on a design. However, also in this case, a protruding portion 120P1 of a stiffener 120 may be disposed between the plurality of second semiconductor chips 132. Other contents overlap those described above, and a detailed description thereof is thus omitted.

As set forth above, according to the exemplary embodiments in the present disclosure, a semiconductor package including an organic interposer capable of having excellent rigidity and a heat dissipation effect, and having excellent reliability without performing a molding process may be provided.

While exemplary embodiments have been shown and described above, it will be apparent to those skilled in the art that modifications and variations could be made without departing from the scope of the present invention as defined by the appended claims.

What is claimed is:

1. A semiconductor package, comprising:
an organic interposer including insulating layers and wiring layers formed on the insulating layers;
a stiffener disposed on the organic interposer and having a through-hole;
a first semiconductor chip disposed in the through-hole on the organic interposer and having an active surface having connection pads disposed thereon and an inactive surface opposing the active surface;
a second semiconductor chip disposed adjacent to the first semiconductor chip in the through-hole on the organic interposer, the second semiconductor chip having an active surface having connection pads disposed thereon and an inactive surface opposing the active surface; and
an underfill resin filling at least portions of the through-hole and fixing the first semiconductor chip and the second semiconductor chip,
wherein the connection pads of the first semiconductor chip and the second semiconductor chip are electrically connected to each other through the wiring layers of the organic interposer,
wherein an upper surface of the underfill resin directly between the first semiconductor chip and the second semiconductor chip is lower than upper surfaces of the first semiconductor chip and the second semiconductor chip,
wherein the second semiconductor chip comprises a plurality of second semiconductor chips, and wherein at least portions of the stiffener are disposed between the plurality of second semiconductor chips,
wherein the plurality of second semiconductor chips are disposed adjacent to the first semiconductor chip on two sides of the first semiconductor chip,
wherein a first protruding portion and a second protruding portion of the stiffener are disposed, respectively, between the plurality of second semiconductor chips and the plurality of second semiconductor chips disposed, respectively, at one side and the other side of the first semiconductor chip, and
wherein the first protruding portion of the stiffener is directly between two adjacent second semiconductor chips among the plurality of second semiconductor chips.

2. The semiconductor package of claim 1, wherein an upper surface of the underfill resin has a step with respect to an upper surface of the stiffener, the inactive surface of the first semiconductor chip, and the inactive surface of the second semiconductor chip.

3. The semiconductor package of claim 2, wherein at least portions of walls of the through-hole of the stiffener, side surfaces of the first semiconductor chip, and side surface of the second semiconductor chip are externally exposed.

4. The semiconductor package of claim 1, further comprising a heat dissipation member disposed on the stiffener, the inactive surface of the first semiconductor chip and the inactive surface of the second semiconductor chip.

5. The semiconductor package of claim 4, wherein an empty space exists between the heat dissipation member and the underfill resin.

6. The semiconductor package of claim 4, wherein an upper surface of the stiffener, the inactive surface of the first semiconductor chip, and the inactive surface of the second semiconductor chip are disposed on the same level, and
the heat dissipation member is attached to the upper surface of the stiffener, the inactive surface of the first semiconductor chip, and the inactive surface of the second semiconductor chip.

7. The semiconductor package of claim 1, wherein the organic interposer includes heat dissipation patterns and heat dissipation vias connecting the first semiconductor chip and the second semiconductor chip to the stiffener.

8. The semiconductor package of claim 1, wherein connection pads of the first semiconductor chip and the second semiconductor chip are connected to the wiring layers of the organic interposer through low melting point metals.

9. The semiconductor package of claim 1, wherein the first semiconductor chip includes an application specific integrated circuit (ASIC), and
the second semiconductor chip include a memory.

10. The semiconductor package of claim 9, wherein the second semiconductor chip includes a second memory, and wherein the first and second memories are disposed adjacent to the ASIC at a first side of the ASIC, and
a first protruding portion of the stiffener is disposed between the first and second memories.

11. The semiconductor package of claim 10, wherein
the second semiconductor chip further include third and fourth memories,
the third and fourth memories are disposed adjacent to the ASIC at a second side of the ASIC, and
a second protruding portion of the stiffener is disposed between the third and fourth memories.

12. The semiconductor package of claim 1, wherein the first semiconductor chip includes a graphics processing unit (GPU), and
the second semiconductor chip include a plurality of high bandwidth memories (HBMs).

13. The semiconductor package of claim 1, wherein the stiffener is attached to the organic interposer through an adhesion member.

14. A semiconductor package, comprising:
a stiffener having a through-hole;
a first semiconductor chip disposed in the through-hole and having an active surface having connection pads disposed thereon and an inactive surface opposing the active surface;
a plurality of second semiconductor chips disposed adjacent to the first semiconductor chip in the through-hole and having active surfaces having connection pads disposed thereon and inactive surfaces opposing the active surfaces, respectively;
an underfill resin filling at least portions of the through-hole and fixing the first semiconductor chip and the plurality of second semiconductor chips; and an organic interposer disposed on the stiffener, the underfill resin, the active surface of the first semiconductor chip, and the active surfaces of the plurality of second semiconductor chips, wherein the organic interposer includes wiring layers electrically connected to the connection pads of the first semiconductor chip and the plurality of second semiconductor chips, the connection pads of the first semiconductor chip and the plurality of second semiconductor chips are electrically connected to each other through the wiring layers of the organic interposer, an upper surface of the underfill resin has a step with respect to an upper surface of the stiffener, the inactive surface of the first semiconductor chip, and the inactive surfaces of the plurality of second semiconductor chips, and at least one protruding portion of the stiffener is directly between two adjacent second semiconductor chips among the plurality of second semiconductor chips.

15. The semiconductor package of claim 14, wherein at least portions of walls of the through-hole of the stiffener, side surfaces of the first semiconductor chip, and side surfaces of the plurality of second semiconductor chips are externally exposed.

16. The semiconductor package of claim 14, wherein the organic interposer further includes thermally conducting members thermally connecting the first semiconductor chip and the plurality of second semiconductor chips to each other and to the stiffener.

* * * * *